United States Patent [19]

Nyswander

[11] 4,109,216
[45] Aug. 22, 1978

[54] MICROWAVE GENERATOR

[75] Inventor: Reuben E. Nyswander, China Lake, Calif.

[73] Assignee: The United States of America as represented by the Secretary of the Navy, Washington, D.C.

[21] Appl. No.: 802,349

[22] Filed: May 31, 1977

[51] Int. Cl.² .................. H03B 9/10; H03K 3/55
[52] U.S. Cl. ..................... 331/87; 307/108; 325/121; 328/65; 332/5
[58] Field of Search ............ 332/5, 9 R; 328/59, 328/63, 65–68, 230; 307/106, 108; 325/121, 141; 331/87

[56] References Cited

U.S. PATENT DOCUMENTS

| | | | |
|---|---|---|---|
| 2,211,404 | 8/1940 | Braden | 179/171.5 |
| 2,411,140 | 11/1946 | Lindenblad | 250/36 |
| 2,730,621 | 1/1956 | Hellings et al. | 250/36 |
| 2,743,360 | 4/1956 | Stanton et al. | 307/108 X |
| 2,898,482 | 8/1959 | Busch | 307/108 |
| 3,028,594 | 4/1962 | Rychlik | 343/17.2 |
| 3,039,064 | 6/1962 | Dain et al. | 331/83 |
| 3,149,292 | 9/1964 | Gamble et al. | 332/5 |
| 3,168,712 | 2/1965 | Backmark | 331/87 |
| 3,296,551 | 1/1967 | Staples | 331/87 |
| 3,358,282 | 12/1967 | Wasterlid | 343/14 |
| 4,051,439 | 9/1977 | Nyswander | 325/121 |

Primary Examiner—Siegfried H. Grimm
Attorney, Agent, or Firm—R. S. Sciascia; Roy Miller; W. Thom Skeer

[57] ABSTRACT

An active radar transmitter is disclosed having both long pulse and short pulse operational modes. The transmitter is configured to switch between the operational modes with a minimum of circuitry to permit a single radar system to be used for long-range search and short-range, high resolution search.

10 Claims, 4 Drawing Figures

MICROWAVE GENERATOR

BACKGROUND OF THE INVENTION

1. Field of the Invention

This invention pertains to radiation physics. More particularly, this invention pertains to microwave radio frequency radiation. In still greater particularity, this invention pertains to radar transmitters. By way of further characterization, but without limitation thereto, this invention pertains to a radar transmitter having two preselected pulse widths.

2. Description of the Prior Art

Present radars are used in a wide variety of applications. For military applications, two common usages for long range search systems are navigation and early detection of relatively large objects such as other naval vessels and aircraft. Additionally, radars are used in high resolution, short range applications such as locating swimmers and small objects of flotsam and jetsam which may be on the surface of the sea. In the past, such dual functions have been performed by separate radar systems. This is largely due to the separate demands of the systems. That is, long range search requires relatively high power pulses to be radiated at relatively longer intervals to permit echo returns from objects located at great distances from the transmitting point to have a sufficient magnitude. On the other hand, the high resolution short range system requires a rapid pulse and a pulse having small dimensions so as to permit useful resolution of targets of small size. The necessity for separate systems to perform these functions has been a serious cost and design consideration in outfitting naval vessels of moderate size having limited room and deck space, not to mention cost considerations of these units.

SUMMARY OF THE INVENTION

The invention consists of a new type of transmitter which can operate with pulses as short as ten nanoseconds, in the short pulse mode, and longer than two microseconds, in the long pulse mode. This dual mode capability overcomes the prior art need for two separate systems and greatly increases the flexibility and usefulness of a single radar system capable of being employed on vehicles of moderate size and power.

DESCRIPTION OF THE PREFERRED EMBODIMENT

Figure 1:
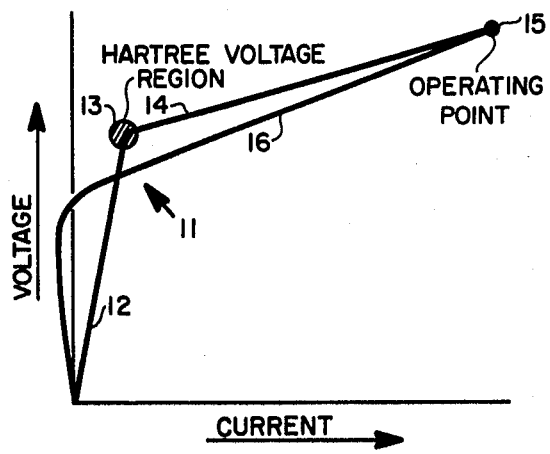
FIG. 1 is a voltage-current diagram of the operational characteristics of a typical magnetron.

Referring to FIG. 1, a typical pulse magnetron has a dynamic voltage-current characteristic represented by the curve 11. As illustrated, the current of the magnetron increases only slowly during an initial application of a voltage pulse indicated at region 12 of curve 11. This is because the space charge which is built up around the cathode of the magnetron prevents oscillation until a characteristic voltage known as the Hartree voltage is obtained. This voltage region illustrated at 13 is the region at which cavity type oscillation commences. However, because of the low current associated with this region little microwave energy is produced by the magnetron at this operational level. As the voltage increases further, as represented by portion 14 of the curve 11, the current in the magnetron increases rapidly until the optimum operating point, illustrated at 15, is obtained. Upon the removal of the voltage pulse the magnetron current falls rapidly as illustrated by portion 16 of curve 11. The slight negative overshoot of portion 16 in returning to the zero current condition is caused by circuit characteristics as is well understood in the electronic arts. It has been discovered that microwave magnetron generators may be used with extremely short pulses if the magnetron is held in the Hartree voltage region prior to the application of the short pulse. Such short pulse modulation techniques, known as pedestal modulators, are well understood in the electronics arts.

Figure 2:
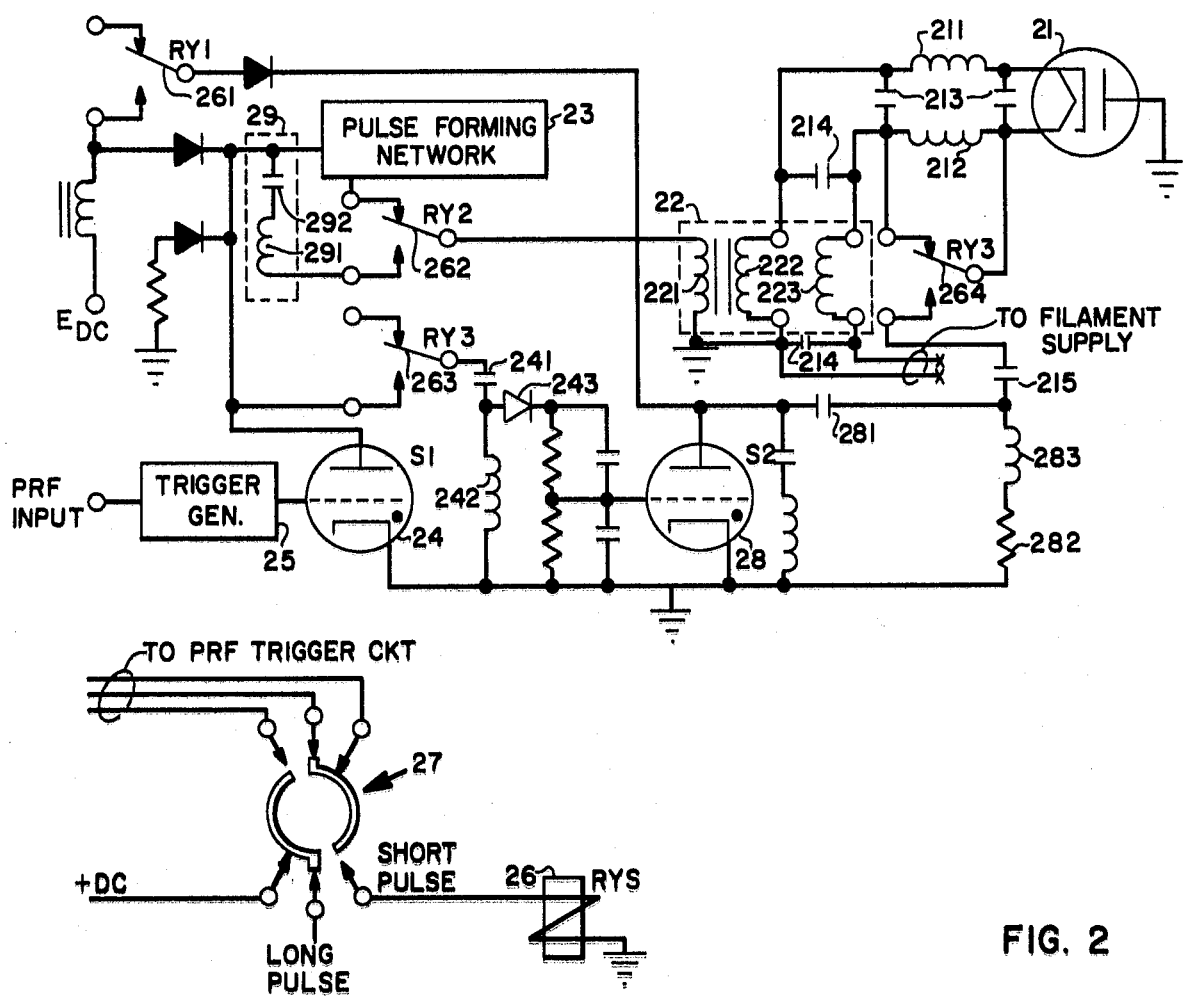
FIG. 2 is a schematic diagram of the radar transmitter according to the invention.

Referring to FIG. 2, a magnetron is illustrated at 21 and has modulation pulses applied to the cathode thereof through a coupling transformer 22 which receives a pulse from a pulse forming network 23 upon actuation of switch 24 by a trigger generator 25. Trigger generator 25 receives an input from the pulse recurrence frequency, PRF, circuitry which is conventional in radar applications. That is, the charge stored in pulse forming network 23 is conducted through switch 24 and a common ground connection to the primary winding 221 of pulse transformer 22 and returned to pulse forming network 23 via switch 262. Switch 262 is one section of a four section double pole double throw relay the solenoid of which is illustrated at 26. As will be readily recognized, the current flowing in the primary 221 of pulse transformer 22 is coupled to the secondary windings 222 and 223 which are, in turn, connected to the cathode of magnetron 21. Such a modulation technique is, of course, conventional and well understood in the microwave transmitting arts.

Figure 3:
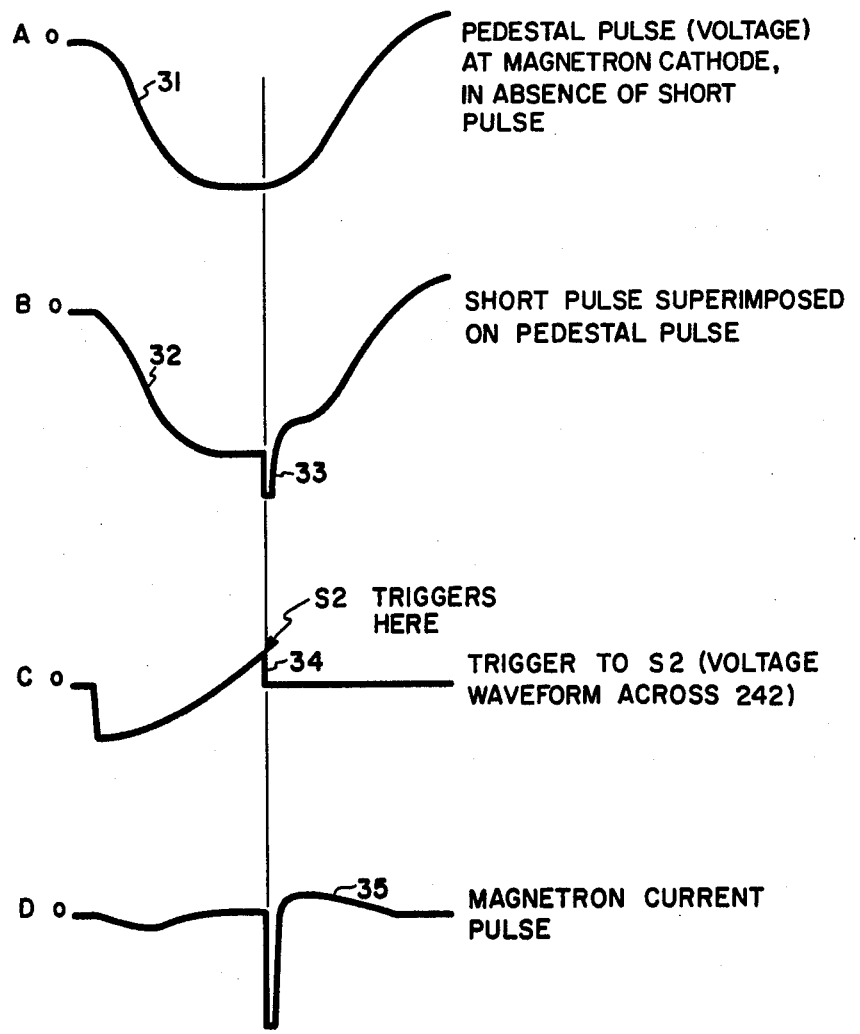
FIG. 3 is a waveform diagram showing waveforms at various points in the circuit of FIG. 2.

Upon actuation of switch 27, relay solenoid 26 is energized by a DC voltage to move the switch contacts of the relay illustrated at 261, 262, 263 and 264 respectively to the nonillustrated position. Such a position supplies B+ voltage from a voltage source indicated at $E_{dc}$ to switch 28 via switch 261. The illustrated diodes, not numbered, in the voltage supply path are conventional devices used in the well understood fashion. In this position, the short pulse mode of operation is selected and the waveforms of FIG. 3 are produced.

In the lower, nonillustrated, position switch 262 connects pulse forming network 29 to primary winding 221 of pulse transformer 22. As shown, pulse forming network 29 comprises an inductance 291 and a capacitor 292 the values of which are chosen to provide a charging and discharging time constant such that in conjunction with pulse transformer 22 the cathode of magnetron 21 is held in the Hartree voltage region, FIG. 3A, waveform 31. Pulse forming network 29 is discharged through switch 24 in the same fashion that pulse forming network 23 was discharged.

When relay solenoid 26 is actuated by switch 27, switch 261 also provides a charging path for capacitor 281 through resistance 282 and inductance 283 such that capacitor 281 is charged to a predetermined value. Capacitor 281 is discharged via switch 28 which receives a trigger impulse due to the discharge of capacitor 241 through switch 263 and switch 24 and inductance 242. This capacitor discharge waveform from capacitor 241 is coupled to switch 28 via diode 243. The values of capacitor 241 and inductance 242 are chosen such that switch 28 is activated when approximately 70 percent of the duration of the pulse from pulse forming network 29 has been experienced by the cathode of magnetron 21. This voltage applied to switch 28 is illustrated in FIG. 3C by waveform 34.

This positive voltage across inductor 242 is coupled through diode 243 to the grid of switch 28 by a divider network. The divider reduces the voltage at the grid to conform with the particular specifications of switch 28. The positive grid voltage, shown as 34, triggers switch 28, the short pulse switch, into full conduction. Diode 243 protects switch 28 from the initial negative voltage appearing across inductor 242 in the well understood fashion. When switch 28 goes into conduction, capacitor 281 discharges, generating the short pulse. One discharge path of capacitor 281 is through switch 28 to ground and through resistance 282 and inductance 283. Additionally, capacitor 281 discharges through capacitor 215 and switch 264 through the magnetron to ground. This supplies the short duration pulse to magnetron 21, producing the short duration pulse 35, FIG. 3D, in the desired timely fashion. Bifilar pulse transformer 22 is isolated from the short duration pulse by means of a bifilar inductance indicated at 211 and 212 which was previously shorted out by switch 264 in the up or long pulse position. This produces the voltage waveform shown at FIG. 3B with a Hartree pedestal 32 having a short pulse 33 imposed thereon.

Thus it may be seen that in the activated position the relay switches have changed the mode of magnetron 21 from a relatively long pulse to a short pulse operation. In order to optimize the circuitry, the PRF trigger input may be increased in frequency by conventional frequency alteration means and may be conveniently controlled by switch 27 such that a single control may change the operation of the transmitter from the long pulse to short pulse mode.

Figure 4:
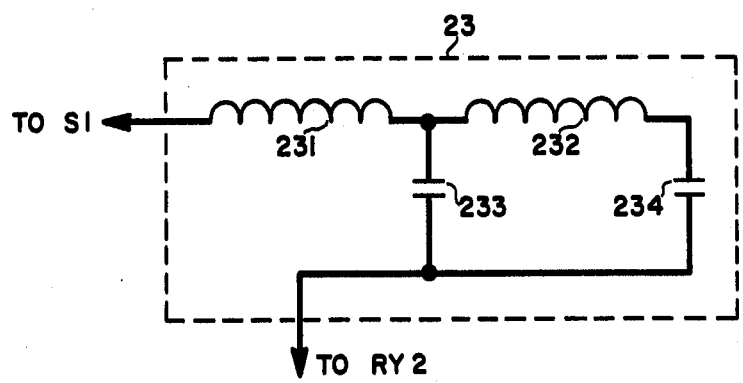
FIG. 4 is a schematic representation of the pulse forming network shown in FIG. 2.

Referring to FIG. 4, a typical arrangement for pulse forming network 23 is illustrated. As shown, inductors 231 and 232 in combination with capacitors 233 and 234 are connected to provide a charged delay line. Such circuit arrangements are conventional and are illustrative of only one variation of pulse forming network 23. If desired, the mode changing relay might be altered to provide different charging voltages for pulse forming network 23 such that pulse forming network 29 may be unnecessary. However, the illustrative arrangement is preferred because of the relative pulse length required by the long and short pulse operation and the fact that capacitor 292, being smaller than capacitors 233 plus 234, permits more rapid d-c resonance charging in the short pulse mode, and hence, a higher pulse recurrence frequency.

The foregoing description taken together with the appended claims constitute a disclosure such as to enable a person skilled in the electronics and microwave arts having benefit of the teachings contained therein to make and use the invention. Further, the structure herein described generally constitutes a meritorious advance in the art unobvious to such an artisan not having the benefit of these teachings.

What is claimed is:

1. A dual mode microwave generator comprising:
    a resonant cavity generator;
    a first modulator electrically connected to said resonant cavity generator for applying a first electrical pulse thereto, said first modulator being selectively actuatable to apply said first electrical pulse having one of two different heights, the first pulse height being sufficient to cause said resonant cavity generator to output a pulse of microwave energy of substantially the same duration as said first pulse, and said second pulse height being sufficient to hold said resonant cavity generator in the Hartree voltage region where microwave oscillation therein is incipient; and
    a second modulator electrically connected to said resonant cavity generator and actuated to supply a second electrical pulse thereto during the application of said first electrical pulse having said second pulse height, the second pulse being of a shorter duration than said first electrical pulse and of an amplitude to cause said resonant cavity generator to produce a microwave energy output for substantially the same duration as said second pulse.

2. A dual mode microwave pulse generator according to claim 1 in which said resonant cavity generator is connected to said first modulator by selectively effective electrical energy attenuation means.

3. A dual mode microwave pulse generator according to claim 2 where said selectively effective attenuation means is configured to attenuate said second pulse to prevent interaction between said first and second modulators.

4. A dual mode microwave pulse generator according to claim 1 wherein said first modulator includes:
    a charged electrical storage means; and
    an electrically actuatable switch connected to said charged electrical storage means for timely discharge thereof.

5. A dual mode microwave pulse generator according to claim 4 wherein said electrical storage means is an inductor-capacitor circuit.

6. A dual mode microwave pulse generator according to claim 5 wherein said inductor-capacitor circuit is selectively altered to provide for the two pulse heights of said first electrical pulse.

7. A dual mode microwave pulse generator according to claim 1 wherein said second modulator includes:
    a charged electrical storage means; and
    an electrically actuatable switch connected to said charged electrical storage means for timely discharge thereof.

8. A dual mode microwave pulse generator according to claim 7 in which said electrically actuatable switch is effectively connected to said first modulator to assure discharge of said electrical storage means during the application of said first electrical pulse having said second pulse height.

9. A dual mode microwave pulse generator according to claim 8 in which said electrically actuatable switch is connected to said first modulator by circuitry which delays the actuation thereof until the passage of the first half of said first pulse.

10. A dual mode microwave pulse generator system comprising:
    a magnetron;
    a source of electrical power;
    a first modulator connected to said magnetron for delivering a first pulse thereto, said first modulator including,
        a first trigger switch,
        a first pulse forming means connected to said source of electrical power for forming an electrical pulse having a first energy level, a second pulse forming means for forming an electrical pulse having a second energy level, a first actuatable switch connected to said trigger switch and to said first and second pulse forming means for selectively connecting one of said first and second pulse forming means to said first trigger switch;

a second actuatable switch, a second modulator connected to said magnetron via said second actuatable switch, said second modulator including, a second trigger switch, a third pulse forming means for forming an electrical pulse having a short duration in comparison to the pulse formed by said second pulse forming means, a third actuatable switch connecting said first and second trigger switch for timed actuation, a fourth actuatable switch connecting said third pulse forming means with said source of electrical power; and actuation means connected to said first, second, third, and fourth actuatable switches for actuation thereof, whereby said magnetron is selectively pulsed by said first modulator or a combination of said first and second modulators.

* * * * *